US012677601B2

(12) United States Patent
Ma et al.

(10) Patent No.: US 12,677,601 B2
(45) Date of Patent: Jul. 7, 2026

(54) QUANTUM CHIP AND FABRICATION METHOD THEREFOR

(71) Applicant: Origin Quantum Computing Technology (Hefei) Co., Ltd, Hefei (CN)

(72) Inventors: Liangliang Ma, Hefei (CN); Wenshu Liu, Hefei (CN); Jie Zheng, Hefei (CN); Nianci Wang, Hefei (CN); Bing You, Hefei (CN)

(73) Assignee: Origin Quantum Computing Technology (Hefei) Co., Ltd, Hefei (CN)

( * ) Notice: Subject to any disclaimer, the term of this patent is extended or adjusted under 35 U.S.C. 154(b) by 644 days.

(21) Appl. No.: 18/308,539

(22) Filed: Apr. 27, 2023

(65) Prior Publication Data

US 2023/0276719 A1     Aug. 31, 2023

Related U.S. Application Data

(63) Continuation of application No. PCT/CN2022/076501, filed on Feb. 16, 2022.

(30) Foreign Application Priority Data

Mar. 9, 2021     (CN) .......................... 202110264015.9

(51) Int. Cl.
| | |
|---|---|
| *H10N 69/00* | (2026.01) |
| *G06N 10/40* | (2022.01) |
| *H01P 3/00* | (2006.01) |

(52) U.S. Cl.
CPC ............. *H10N 69/00* (2023.02); *G06N 10/40* (2022.01); *H01P 3/003* (2013.01)

(58) Field of Classification Search
None
See application file for complete search history.

(56) References Cited

U.S. PATENT DOCUMENTS

| | | | |
|---|---|---|---|
| 2018/0013052 A1* | 1/2018 | Oliver .................. | H10N 60/805 |
| 2019/0006572 A1 | 1/2019 | Falcon et al. | |

(Continued)

FOREIGN PATENT DOCUMENTS

| | | |
|---|---|---|
| CN | 109891591 A | 6/2019 |
| CN | 214378496 U | 10/2021 |

(Continued)

OTHER PUBLICATIONS

Extended European Search Report issued in counterpart European Patent Application No. 22766130.3, dated Apr. 30, 2024.

(Continued)

*Primary Examiner* — Hung K Vu
(74) *Attorney, Agent, or Firm* — Westbridge IP LLC

(57) ABSTRACT

Disclosed are a quantum chip and a fabrication method therefor. The quantum chip includes a base substrate on which signal transmission lines are formed; and at least one insulating substrate located on the base substrate, where a qubit and a through hole penetrating through the insulating substrate are formed on the insulating substrate, a metal piece is formed in the through hole, and two ends of the metal piece are electrically connected to the signal transmission lines and the qubit, respectively.

17 Claims, 7 Drawing Sheets

(56) References Cited

U.S. PATENT DOCUMENTS

| | | | |
|---|---|---|---|
| 2019/0044047 A1 | 2/2019 | Elsherbini et al. | |
| 2020/0012961 A1 | 1/2020 | Kelly et al. | |
| 2020/0161531 A1* | 5/2020 | Olivadese ............ | H10N 60/815 |

FOREIGN PATENT DOCUMENTS

| | | | |
|---|---|---|---|
| WO | 2019117972 A1 | 6/2019 | |
| WO | 2019117973 A1 | 6/2019 | |
| WO | 2019117974 A1 | 6/2019 | |
| WO | 2019117975 A1 | 6/2019 | |

OTHER PUBLICATIONS

Yost et al., Solid-state qubits integrated with superconducting through-silicon vias, npj Quantum Information. vol. 6, No. 1, dated Sep. 29, 2020.
International Search Report issued in corresponding PCT Application No. PCT/CN2022/076501, dated May 5, 2022.

* cited by examiner 702     7011     50

702     7011     50

QUANTUM CHIP AND FABRICATION METHOD THEREFOR

CROSS-REFERENCE TO RELATED APPLICATIONS

This application is a continuation of International Application No. PCT/CN2022/076501, filed on Feb. 16, 2022, which claims priority to Chinese Patent Application No. 202110264015.9, filed with the China National Intellectual Property Administration on Mar. 9, 2021 and entitled "QUANTUM CHIP AND FABRICATION METHOD THEREFOR". The disclosures of the aforementioned applications are hereby incorporated by reference in their entireties.

TECHNICAL FIELD

The present application belongs to the field of quantum technologies, and in particular, relates to a quantum chip and a fabrication method therefor.

BACKGROUND

With the rapid development of manufacturing technologies of a modern large-scale integrated circuit, a size of an integrated component within a chip is also continuously reduced, with a quantum effect becoming increasingly non-negligible. In many solutions to the failure crisis of Moore's law, a quantum processor (also referred to as a quantum chip) designed based on principles of quantum mechanics has become an important layout and vital interest in the scientific and technological fields in various countries in the world due to its breakthrough performance improvement and excellent quantum algorithm applications (for example, performing current classic computer key assignment, cracking, and the like).

Compared with a classical integrated circuit chip that constructs classical bits by means of one transistor, the quantum chip constructs qubits by using different physical systems, for example, a superconducting quantum chip uses a Josephson junction to implement a two-level system, and a semiconductor quantum dot uses electric field bound quantum dots to implement a two-level system. The superconducting quantum chip based on a Josephson junction has advantages such as good scalability and high gate-operation fidelity, and thus is one of the most promising systems for implementing quantum computing.

The larger a quantity of qubits on a superconducting quantum chip, the stronger the computing power of a quantum computer. However, integration of qubits and corresponding signal transmission lines on a surface of a substrate having a limited area makes it difficult to expand the quantity of qubits.

SUMMARY

The present application provides a quantum chip and a fabrication method thereof, to solve a problem in the related technologies that qubits on a quantum chip are difficult to expand. According to the quantum chip and the fabrication method thereof provided in the present application, signal transmission lines and a qubit can be formed on different circuit layers to implement an electrical connection, thereby improving an integration degree of a quantum chip.

Some implementations of the present application provide a quantum chip, which may include: a base substrate on which signal transmission lines are formed; and at least one insulating substrate, where the insulating substrate is located on the base substrate and a qubit and a through hole penetrating through the insulating substrate are formed on the insulating substrate, a metal piece is formed in the through hole, and two ends of the metal piece are electrically connected to the signal transmission lines and the qubit, respectively.

According to the quantum chip described above, in an implementation, the signal transmission lines may include: a qubit control signal line coupled to the qubit, where the qubit control signal line is configured to control information of the qubit; a qubit microwave resonant cavity coupled to the qubit, where the qubit microwave resonant cavity is configured to read information of the qubit; and a qubit read signal line coupled to the qubit microwave resonant cavity, where the qubit read signal line is configured to read information output by the qubit microwave resonant cavity.

According to the quantum chip described above, in an implementation, the qubit microwave resonant cavity may include a coplanar waveguide transmission line.

According to the quantum chip described above, in an implementation, an isolation layer is further included. The isolation layer may be located between the base substrate and the insulating substrate, and the through hole penetrates through the isolation layer.

According to the quantum chip described above, in an implementation, the isolation layer may include: an insulating isolation layer located on the base substrate, where the insulating isolation layer covers the signal transmission lines, and the through hole penetrates through the insulating isolation layer; and a metal isolation layer located on the insulating isolation layer, where a via hole for forming a mesh is formed on the metal isolation layer. The through hole is located in the via hole for forming a mesh. That is to say, a coverage region of the through hole is allowed to be located within a coverage region of the via hole for forming a mesh.

According to the quantum chip described above, in an implementation, an aperture of the via hole for forming a mesh may be greater than an aperture of the through hole, and the via hole for forming a mesh and the through hole may be coaxially arranged.

According to the quantum chip described above, in an implementation, the at least one insulating substrate may include: a first insulating substrate located on the base substrate, where a first qubit and a through hole penetrating through the first insulating substrate are formed on the first insulating substrate, a metal piece is formed in the through hole, and two ends of the metal piece are electrically connected to the signal transmission lines and the first qubit, respectively; and a second insulating substrate located on the first insulating substrate, where a second qubit and a through hole penetrating through both the second insulating substrate and the first insulating substrate are formed on the second insulating substrate, a metal piece is formed in the through hole, and two ends of the metal piece are electrically connected to the signal transmission lines and the second qubit, respectively.

According to the quantum chip described above, in an implementation, the metal piece may fully fill the through hole and may be configured to implement an electrical connection between the base substrate and a circuit structure on the insulating substrate.

According to the quantum chip described above, in an implementation, the metal piece may be a metal film formed on an inner surface of the through hole.

According to the quantum chip described above, in an implementation, the metal piece may be formed in a columnar shape inside the through hole.

According to the quantum chip described above, in an implementation, a capacitor for connecting the qubit and the metal piece may be formed on the insulating substrate.

According to the quantum chip described above, in an implementation, adjacent qubits may be coupled with each other through the capacitor.

According to the quantum chip described above, in an implementation, when the quantum chip is a superconducting quantum chip, the qubit may include a loop superconducting circuit and the capacitor, and the metal piece connected to the qubit and located in the through hole may be connected to the loop superconducting circuit.

According to the quantum chip described above, in an implementation, the loop superconducting circuit may include at least two superconducting Josephson junctions connected in parallel.

According to the quantum chip described above, in an implementation, the quantum chip may further include signal terminals, and the signal terminals are formed on a side surface of the base substrate and electrically connected to the signal transmission lines in a one-to-one correspondence manner.

Some other implementations of the present application provide a fabrication method for a quantum chip, which may include: providing a base substrate on which signal transmission lines are formed; and forming at least one insulating substrate on the base substrate, where a qubit and a through hole penetrating through the insulating substrate are formed on the insulating substrate, a metal piece is formed in the through hole, and two ends of the metal piece are electrically connected to the signal transmission lines and the qubit, respectively.

According to the fabrication method described above, in an implementation, the step of forming at least one insulating substrate on the base substrate, where a qubit and a through hole penetrating through the insulating substrate are formed on the insulating substrate, a metal piece is formed in the through hole, and two ends of the metal piece are electrically connected to the signal transmission lines and the qubit, respectively may include: forming a first insulating substrate on the base substrate, where a first qubit and a through hole penetrating through the first insulating substrate are formed on the first insulating substrate, a metal piece is formed in the through hole, and two ends of the metal piece are electrically connected to the signal transmission lines and the first qubit, respectively; and forming a second insulating substrate on the first insulating substrate, where a second qubit and a through hole penetrating through both the second insulating substrate and the first insulating substrate are formed on the second insulating substrate, a metal piece is formed in the through hole, and two ends of the metal piece are electrically connected to the signal transmission lines and the second qubit, respectively.

Compared with the related technologies, the quantum chip of the present application includes: a base substrate on which signal transmission lines are formed; and at least one insulating substrate located on the base substrate, where a qubit and a through hole penetrating through the insulating substrate are formed on the insulating substrate, a metal piece is formed in the through hole, and two ends of the metal piece are electrically connected to the signal transmission lines and the qubit, respectively. In the present application, the signal transmission lines and the qubit are respectively formed on the base substrate and the insulating substrate, and the through hole penetrating through the insulating substrate and the metal piece located in the through hole are formed. The signal transmission lines on the base substrate and the qubit on the insulating substrate are electrically connected by means of the metal piece, so that signal transmission is implemented between the signal transmission lines and the qubit, forming a complete qubit circuit located on different layers. In addition, a plurality of insulating substrates may be stacked to form qubits located on different layers, thereby jointly forming a quantum chip in which a quantity of qubits is easy to expand. In this way, an integration degree of the quantum chip is improved.

DETAILED DESCRIPTION OF THE EMBODIMENTS

The embodiments described below with reference to the accompanying drawings are exemplary and merely used to explain the present application, but cannot be understood as a limitation on the present application.

To make the objectives, technical solutions, and advantages of the embodiments of the present application clearer, the following describes the embodiments of the present application in detail with reference to the accompanying drawings. However, a person of ordinary skill in the art may understand that many technical details are put forward in the embodiments of the present application to make a reader better understand the present application. However, even without the technical details and various changes and modifications on a basis of the following embodiments, the technical solutions claimed in the present application may be implemented. The division of the following embodiments is for convenience of description, and should not constitute any limitation on the specific implementations of the present application, and various embodiments may be mutually referenced on the premise of no contradiction.

It should be noted that the terms "first", "second" and the like in this specification, claims, and drawings of the present application are used to distinguish between similar objects, rather than to describe a particular order or a sequential order. It should be understood that the data used in this way may be interchangeable under appropriate circumstances such that embodiments of the present application described herein are capable of being implemented in an order different from that illustrated or described herein. In addition, the terms "include" and "have" and any other variants thereof are intended to cover the non-exclusive inclusion. For example, a process, method, system, product, or device that includes a series of steps or units is not necessarily limited to those expressly listed steps or units, but may include other steps or units not expressly listed or inherent to such process, method, product, or device.

In addition, it should be understood that when a layer (or film), region, pattern, or structure is referred to as being "on" a substrate, layer (or film), region, and/or pattern, it may be directly on another layer or substrate, and/or there may be an insertion layer. In addition, it should be understood that when a layer is referred to as being "under" another layer, it may be directly under another layer, and/or there may be one or more insertion layers. In addition, for "on" a layer and "under" a layer, reference may be made to the figures.

The solutions proposed in the present application are intended to solve a problem that it is difficult to expand a quantity of qubits because at present a manner of integrating qubits and corresponding signal transmission lines on a surface of a substrate having a limited area is used.

Figure 1:
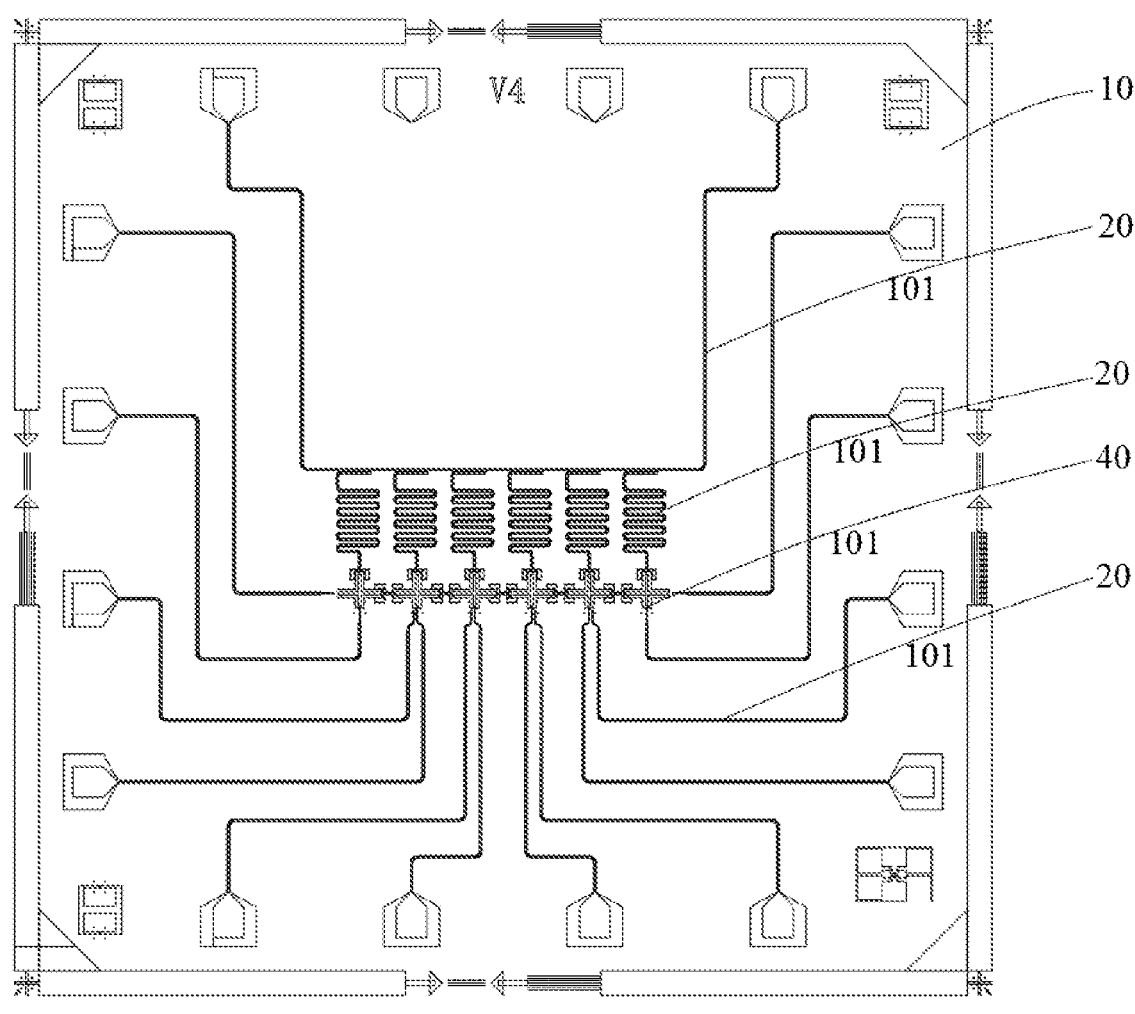
FIG. 1 is a schematic structural diagram of a 6-bit superconducting quantum chip according to the related technologies.

A quantum chip structure shown in FIG. 1 is a structural diagram designed by the applicant according to the related technologies for forming six qubits 40 and corresponding signal transmission lines 20 on a surface of a two-dimensional substrate. It may be seen from the figure that the six qubits 40 occupy a few structural dimensions on the surface of the substrate, and most of surface structures are occupied by the signal transmission lines 20. In addition, due to the physical structure of the qubits 40, wiring of the signal transmission lines 20 may be limited. It is contemplated that if more bits of qubits 40 need to be integrated on the surface of the two-dimensional substrate, the integration may be very difficult due to size limitation of a chip, making it difficult to extend the quantity of qubits 40. Through research and experiments of the inventors, a novel quantum chip structure that facilitates extension of a quantity of qubits 40 is proposed.

Some embodiments of the present application provide a quantum chip.

Figure 2:
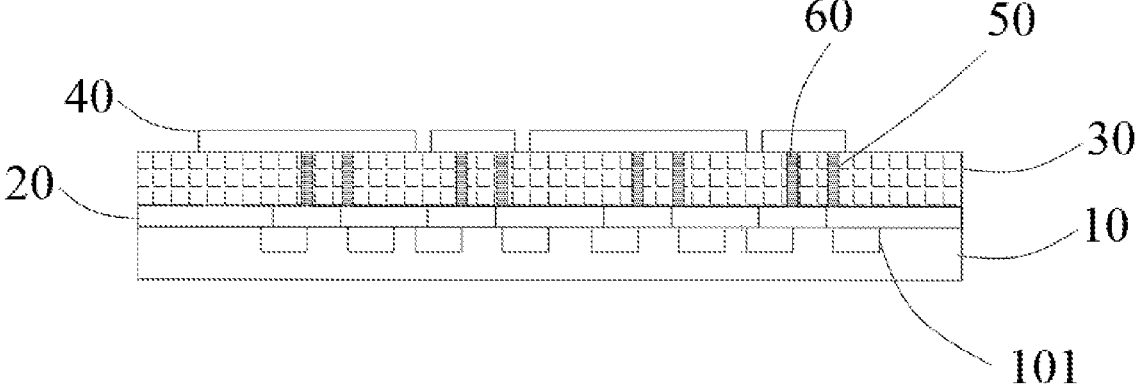
FIG. 2 is a schematic structural diagram of a quantum chip according to an embodiment of the present application.

FIG. 2 is a schematic structural diagram of a quantum chip according to an embodiment of the present application.

With reference to FIG. 2, a quantum chip provided in an embodiment of the present application may include: a base substrate 10 on which signal transmission lines 20 are formed; and at least one insulating substrate 30, where the at least one insulating substrate 30 is located on the base substrate 10, a qubit 40 and a through hole 50 penetrating through the insulating substrate 30 are formed on the insulating substrate 30, a metal piece 60 is formed in the through hole 50, and two ends of the metal piece 60 are electrically connected to the signal transmission lines 20 and the qubit 40, respectively.

In particular, the base substrate 10 may include a substrate in the field of semiconductor chips, for example, a sapphire substrate, a silicon substrate, a silicon carbide substrate, or a gallium nitride substrate. In the present application, a silicon carbide substrate is preferably selected as the base substrate 10, so that a quantum chip formed easily has a good thermal conductivity, thereby greatly reducing thermal power consumption during operation of the quantum chip, and making thermal power consumption and thermal radiation in a quantum computing system including the quantum chip reduced.

In addition, the signal transmission lines 20 for regulating and controlling the qubit 40 are all integrated on the base substrate 10, and the qubit 40 is formed on another insulating substrate 30, so that regulation and control of the connected qubit 40 by a signal on the signal transmission lines 20 are more accurate, and a crosstalk impact on another qubit 40 may be reduced.

For a process of forming the signal transmission lines 20 on the base substrate 10, reference may be made to a semiconductor chip fabrication process in the related technologies as follows: first, forming a metal layer on a surface of the base substrate 10 by using an evaporation method, atomic deposition method, and the like; and then performing patterning, exposing, developing, and etching on the metal layer to form desired signal transmission lines 20. A more detailed process is not described again in the embodiment of the present application.

After the signal transmission lines 20 for regulating and controlling the qubit 40 is formed on the base substrate 10, a layer of insulating substrate 30 for arrangement of a circuit structure of the qubit 40 is formed on the base substrate 10. The insulating substrate 30 may be formed on the base substrate 10 by separately processing the insulating substrate 30 and grafting the insulating substrate 30 onto the base substrate 10, or may be formed directly on the base substrate 10 by using an atomic deposition process or a sputtering process. In the present application, the second method is used, that is, the insulating substrate 30 is formed on the base substrate 10 by using a sputtering process. Additionally, the signal transmission lines 20 are formed on a surface of the base substrate 10, and the insulating substrate 30 formed on the base substrate 10 covers a surface of the signal transmission lines 20, so as to isolate the signal transmission lines 20 from a circuit structure of the qubit 40, thereby achieving insulation and isolation functions.

Therefore, after the insulating substrate 30 on the surface of the signal transmission lines 20 is formed, the circuit structure of the qubit 40 may be formed on the surface of the insulating substrate 30. Certainly, the circuit structure of the qubit 40 formed in this case is disconnected from the signal transmission lines 20. Before the circuit structure of the qubit 40 is formed, a through hole 50 penetrating through the insulating substrate 30 needs to be formed on the insulating substrate 30, and a metal piece 60 is filled in the through hole 50; therefore, the signal transmission lines 20 and the qubit 40 may be electrically connected by means of the metal piece 60. The circuit structure of the qubit 40 may be formed on the surface of the insulating substrate 30 after the through hole 50 and the metal piece 60 located in the through hole 50 are prepared on the insulating substrate 30.

The formed circuit structure of the qubit 40 is electrically connected to one end of the metal piece 60, and the other end of the metal piece 60 is electrically connected to the signal transmission lines 20 on the base substrate 10. In this way, the circuit structure of the qubit 40 and the signal transmission lines 20 are electrically connected by means of the metal piece 60, so that signal transmission is implemented between the signal transmission lines 20 and the qubit 40, constructing a complete circuit structure of the qubit 40.

Compared with the related technologies, in the present application, the signal transmission lines 20 and the qubit 40 are respectively formed on the base substrate 10 and the insulating substrate 30, the through hole 50 penetrating through the insulating substrate 30 and the metal piece 60 located in the through hole 50 are formed, and then the signal transmission lines 20 on the base substrate 10 and the qubit 40 on the insulating substrate 30 are electrically connected by means of the metal piece 60, so that signal transmission is implemented between the signal transmission lines 20 and the qubit 40, forming a complete qubit circuit located on different layers. In addition, a plurality of insulating substrates 30 that are stacked may be used for forming qubits 40 located on insulating substrates 30 in different layers, thereby expanding a quantity of the qubits 40 to an enough amount. In this way, an integration degree of a quantum chip is improved.

Figure 3:
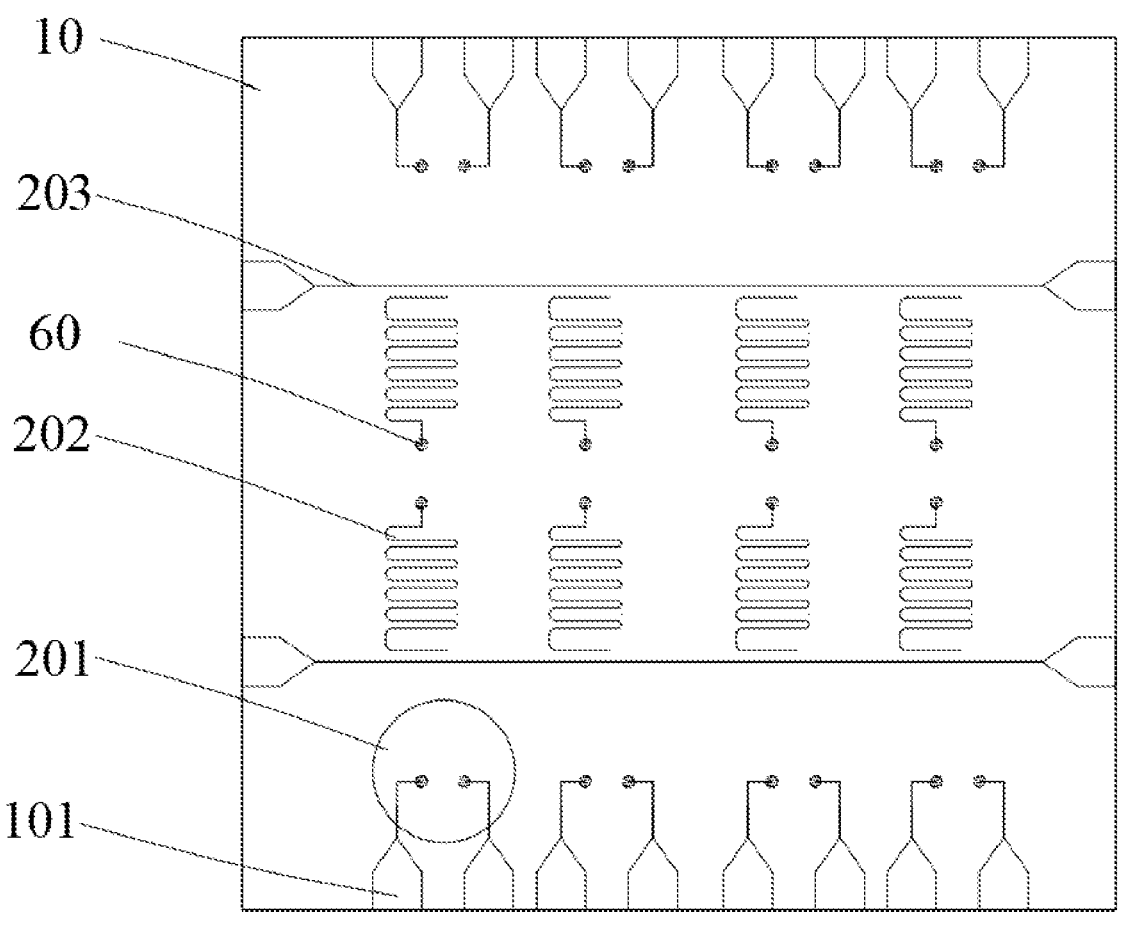
FIG. 3 is a schematic circuit diagram of signal transmission lines on a base substrate according to an embodiment of the present application.

For example, as shown in FIG. 3, the signal transmission lines 20 provided in the embodiment of the present application include: a qubit control signal line 201 coupled to the qubit 40, where the qubit control signal line 201 is configured to regulate and control information of the qubit 40; a qubit microwave resonant cavity 202 coupled to the qubit 40, where the qubit microwave resonant cavity 202 is configured to read information of the qubit 40; and a qubit read signal line 203 coupled to the qubit microwave resonant cavity 202, where the qubit read signal line 203 is configured to read information output by the qubit microwave resonant cavity 202.

In the field of quantum computing, a quantum chip running quantum computing integrates a plurality of computing units (namely, qubits 40), and each qubit 40 is a two-level system. Transition frequency and transition energy of an energy level system of each qubit 40 are both regulated and controlled by using an applied regulation signal, for example, the transition frequency of the qubit 40 is regulated and controlled by applying a direct-current bias signal and the transition energy of the qubit 40 is regulated and controlled by applying a microwave signal. Therefore, each qubit 40 needs to be provided with a corresponding qubit control signal line 201, and the qubit control signal line 201 is configured to transmit an applied regulation and control signal to the qubit 40. In addition, in order to read information of a regulated and controlled qubit 40, a corresponding qubit read signal line 203 further needs to be disposed to read the qubit 40. Since response sensitivity of the qubit 40 to a signal is very high, the qubit 40 cannot be read directly through the qubit read signal line 203, and need to be read indirectly by means of the qubit microwave resonant cavity 202, and then information of the qubit 40 fed back through the qubit microwave resonant cavity 202 is read through the qubit read signal line 203.

For example, as shown in FIG. 3, the qubit microwave resonant cavity 202 provided in the embodiment of the present application includes a coplanar waveguide transmission line. The qubit microwave resonant cavity 202 is formed on the base substrate 10 and a form of a coplanar waveguide transmission line is used, which is easy to prepare, and compared with the form of microstrip transmission lines, less crosstalk occurs between signals transmitted on the coplanar waveguide transmission lines.

Figure 4:
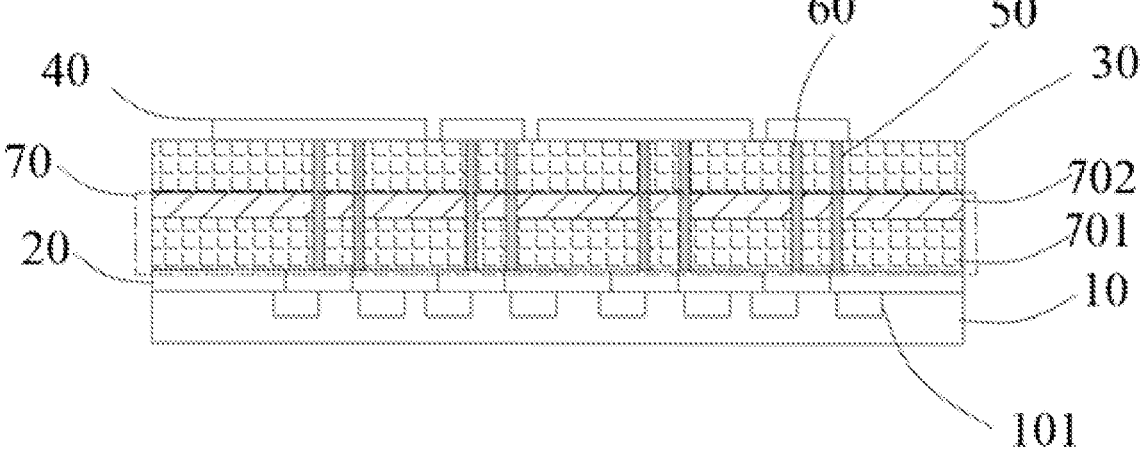
FIG. 4 is a schematic structural diagram of a quantum chip including an isolation layer according to an embodiment of the present application.
Figure 5A:
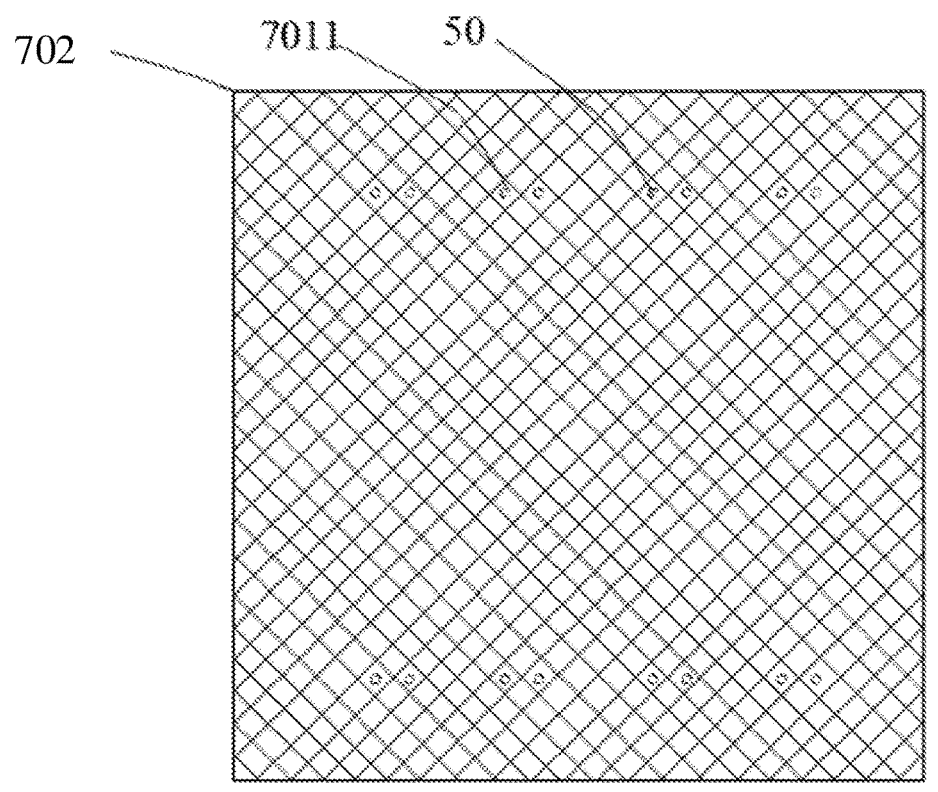
FIG. 5a, FIG. 5b, FIG. 5c, and FIG. 5d are schematic diagrams of a shape of a via hole for forming a mesh on a metal isolation layer according to an embodiment of the present application.
Figure 5B:
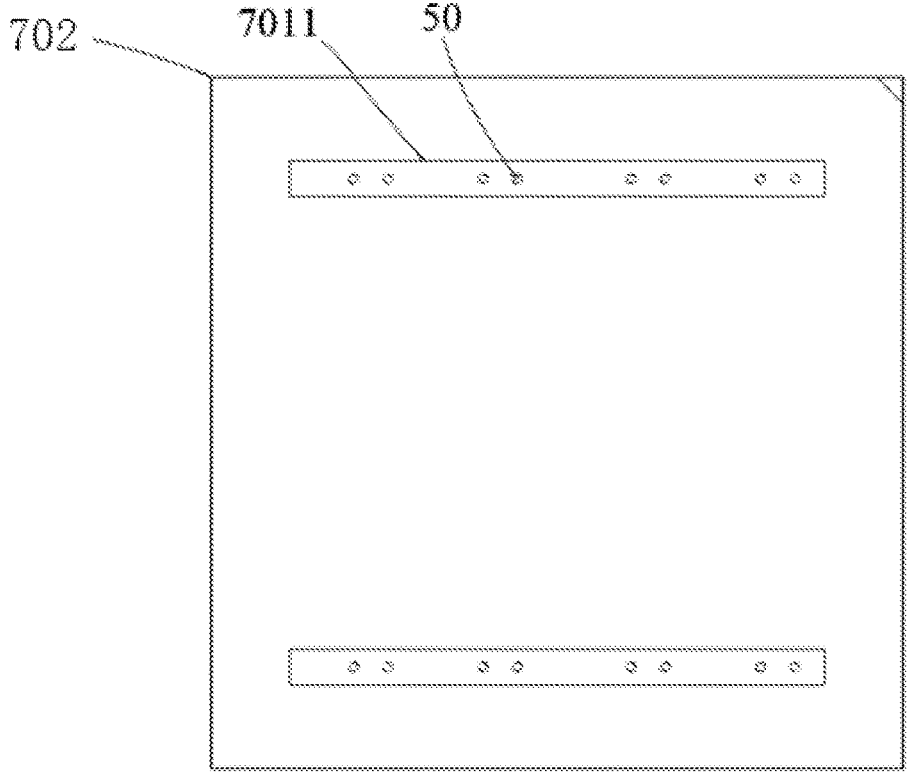
Figure 5C:
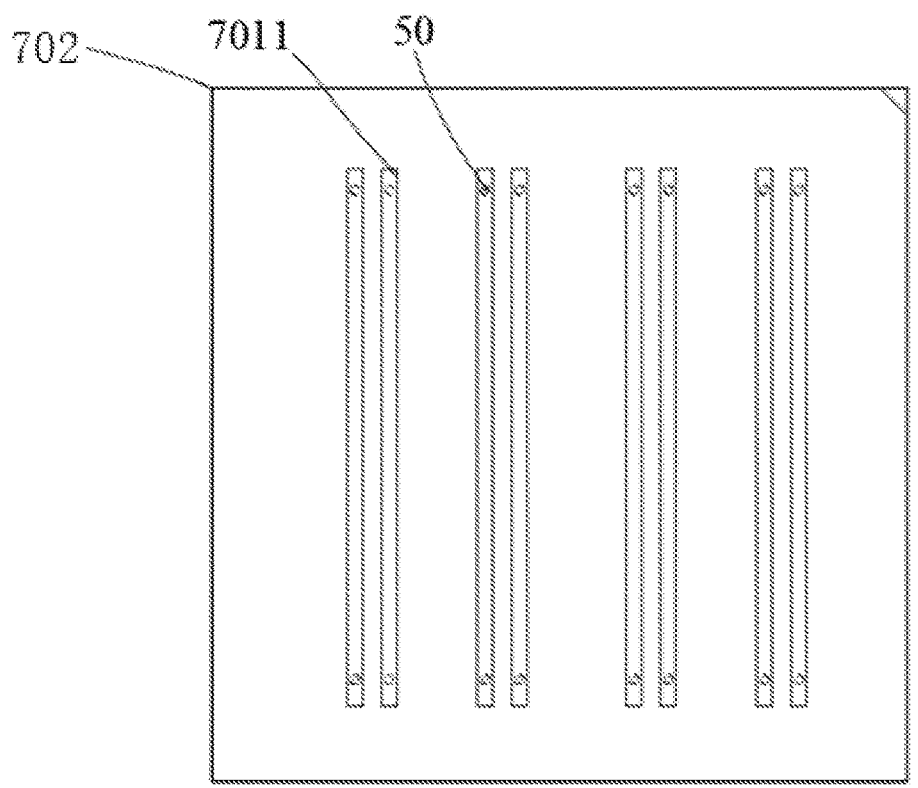
Figure 5D:
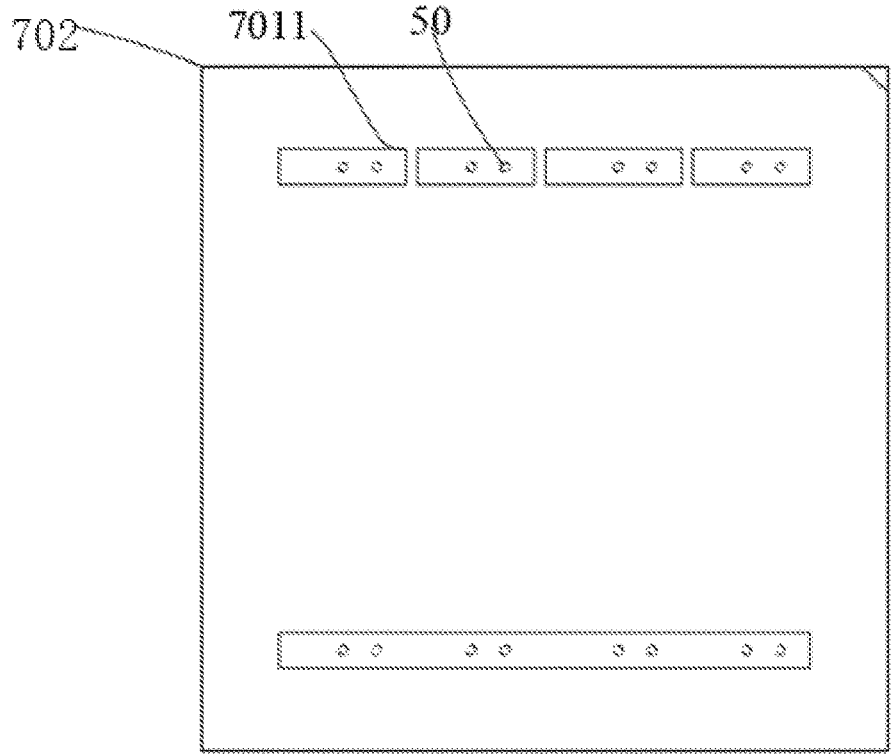

As shown in FIG. 4, for example, the quantum chip provided in the embodiment of the present application further includes an isolation layer 70, where the isolation layer 70 is located between the base substrate 10 and the insulating substrate 30, and the through hole 50 penetrates through the isolation layer 70.

The embodiment of the present application provides a quantum chip structure, that is, a layer of isolation layer 70 is formed between the base substrate 10 and the insulating substrate 30. In order to ensure that electrical connection can be implemented between the signal transmission lines 20 on the base substrate 10 and the qubit 40 on the insulating substrate 30, the through hole 50 also needs to penetrate through the formed isolation layer 70, that is, the through hole 50 penetrates through the insulating substrate 30 and the isolation layer 70. In addition, the metal piece 60 is formed in the through hole 50, and two ends of the metal piece 60 are respectively electrically connected to the signal transmission lines 20 on the base substrate 10 and the qubit 40 on the insulating substrate 30. In this way, signal transmission between the signal transmission lines 20 and the qubit 40 is implemented.

During specific implementation and test, the applicant finds that, when an isolation layer 70 is formed between the base substrate 10 and the insulating substrate 30, an isolation effect between the signal transmission lines 20 on the base substrate 10 and the qubit 40 on the insulating substrate 30 may be improved, so that there is less crosstalk impact of a signal transmitted on the signal transmission lines 20 on another qubit 40. For example, the isolation layer 70 provided in the embodiment of the present application may include: an insulating isolation layer 701 located on the base substrate 10, where the insulating isolation layer 701 covers the signal transmission lines 20, and the through hole 50 penetrates through the insulating isolation layer 701; and a metal isolation layer 702 located on the insulating isolation layer 701, where a via hole 7011 for forming a mesh is formed in the metal isolation layer 702, and the through hole 50 is located in the via hole 7011 for forming a mesh.

In the embodiment of the present application, the metal isolation layer 702 is used, and the metal isolation layer 702 is disposed between the base substrate 10 and the insulating substrate 30, so that there has a good isolation effect between the signal transmission lines 20 on the base substrate 10 and the qubit 40 on the insulating substrate 30. Specifically, a material of the metal isolation layer 702 includes one of copper, aluminum, gold, and niobium or a metal or an alloy of another material, as long as an effect of isolation can be achieved. In a specific implementation of the present application, copper is preferably selected, because copper has a low cost and a simple fabrication process.

In addition, the metal isolation layer 702 not only is located on the base substrate 10, but also covers the signal transmission lines 20 and contacts the signal transmission lines 20. If the metal isolation layer 702 is directly formed on the signal transmission lines 20, a short circuit may be caused between the metal isolation layer 702 and the signal transmission lines 20. Therefore, an insulating isolation layer 701 needs to be further disposed between the metal isolation layer 702 and the signal transmission lines 20, and the insulating isolation layer 701 is configured to protect the signal transmission lines 20 from being short circuited by the metal isolation layer 702. In addition, the insulating substrate 30 is formed on an upper surface of the metal isolation layer 702, and because the insulating substrate 30 is made of an insulating material, the qubit 40 formed on the insulating substrate 30 is not affected. A material of the insulating isolation layer 701 includes one of silicon dioxide, amorphous silicon and Teflon. In a specific implementation of the present application, silicon dioxide is preferably used, because silicon dioxide has a simple fabrication process.

Additionally, the through hole 50 also needs to be formed in the insulating isolation layer 701 and the metal isolation layer 702 that are formed between the base substrate 10 and the insulating substrate 30. In addition, because the metal isolation layer 702 is a metal isolation layer, a via hole 7011 for forming a mesh with an aperture greater than that of the through hole 50 needs to be further formed on the metal isolation layer 702. Furthermore, the via hole 7011 for forming a mesh and the through hole 50 are coaxially disposed, so that the through hole 50 is located in the via hole 7011 for forming a mesh. That is to say, a coverage region of the through hole 50 is allowed to be located within a coverage region of the via hole 7011 for forming a mesh, so as to ensure that there is no short circuit between the metal isolation layer 702 and the metal piece 60 in the through hole 50 penetrating through the metal isolation layer 702.

As shown in FIG. 5_a_, an embodiment of the present application provides a structure in which a via hole 7011 for forming a mesh is formed in a metal isolation layer 702. To form the via hole 7011 for forming a mesh in the metal isolation layer 702, a metal layer may be first formed on an insulating isolation layer 701, and then the via hole 7011 for forming a mesh is formed by using an etching process. A position of the via hole 7011 for forming a mesh needs to be set based on a position of the through hole 50, so as to ensure that the through hole 50 penetrating through the insulating substrate 30, the insulating isolation layer 701, and the metal isolation layer 702 is located inside the via hole 7011 for forming a mesh. That is to say, a coverage region of the through hole 50 is allowed to be located within a coverage area of the via hole 7011 for forming a mesh, to ensure that after the metal piece 60 in the through hole 50 electrically connects the signal transmission lines 20 on the base substrate 10 and the qubit 40 on the insulating substrate 30, there is no short circuit between the metal piece 60 and the metal isolation layer 702.

The hole of the metal isolation layer 702 shown in FIG. 5_a_ is a structure of the via hole 7011 for forming a mesh. In addition, the via hole 7011 for forming a mesh may also have a variety of hole-like structures, such as strip-shaped holes shown in FIG. 5_b_, FIG. 5_c_, and FIG. 5_d_, so long as a hole in the metal isolation layer 702 can surround the through hole 50, and ensure that there is no short circuit between the metal isolation layer 702 and the metal piece 60 in the through hole 50.

Figure 6:
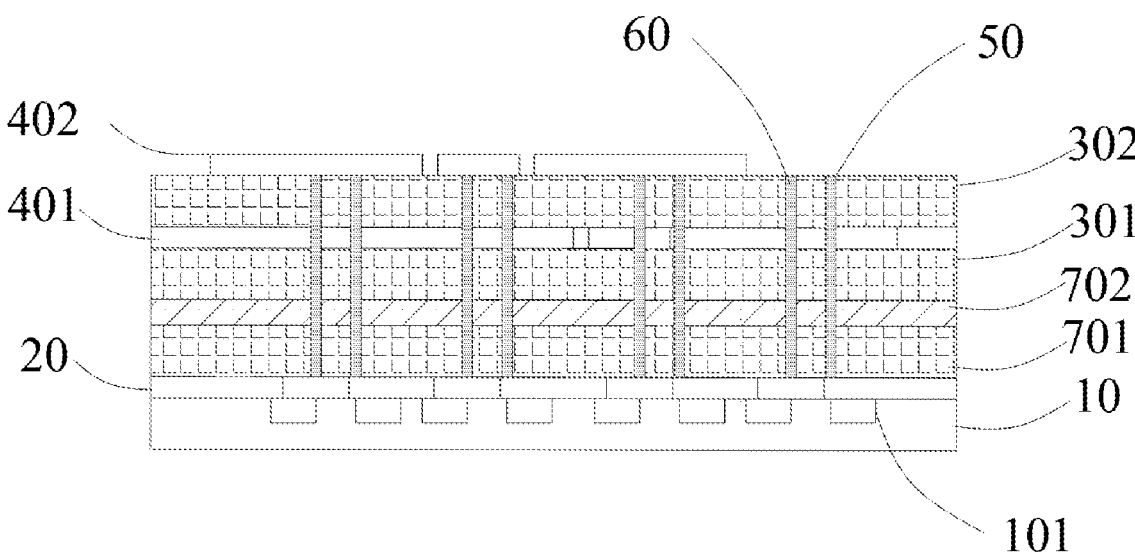
FIG. 6 is a schematic structural diagram of another quantum chip according to an embodiment of the present application.

As shown in FIG. 6, for example, the at least one insulating substrate provided in the embodiment of the present application may include a first insulating substrate 301 and a second insulating substrate 302. The first insulating substrate 301 is located on the base substrate 10, a first qubit 401 and a through hole 50 are formed on the first insulating substrate 301, the through hole 50 penetrates through the first insulating substrate 301, a metal piece 60 is formed in the through hole 50, and two ends of the metal piece 60 are electrically connected to the signal transmission lines 20 and the first qubit 401, respectively, so as to implement signal transmission between the signal transmission lines 20 and the first qubit 401. The second insulating substrate 302 is located on the first insulating substrate 301, a second qubit 402 and a through hole 50 are formed on the second insulating substrate 302, the through hole 50 penetrates through the second insulating substrate 302, a metal piece 60 is formed in the through hole 50, and two ends of the metal piece 60 are electrically connected to the signal transmission lines 20 and the second qubit 402, respectively, so as to implement signal transmission between the signal transmission lines 20 and the second qubit 402.

Specifically, a structure in which a plurality of layers of insulating substrates 30 are stacked may be used, for example, when there are a plurality of qubits 40 for a superconducting quantum chip and it is difficult to integrate circuit structures of the plurality of qubits 40 on one layer of insulating substrate 30, a plurality of layers of insulating substrates 30 that are stacked may be formed, and a circuit structure of a qubit 40 may be formed on a surface of each insulating substrate 30. In addition, a through hole 50 penetrating through the insulating substrate 30 needs to be formed in each insulating substrate 30 in the plurality of layers of insulating substrates 30, and a metal piece 60 is formed in the through hole 50, so that all circuits of the qubits 40 on the surface of the plurality of layers of insulating substrates 30 are electrically connected to the signal transmission lines 20 on the base substrate 10 by means of the metal piece 60.

The first insulating substrate 301 and the second insulating substrate 302 described in the embodiment of the present application are merely examples, and a third insulating substrate, a fourth insulating substrate, and more insulating substrates may be further formed on the second insulating substrate 302. A through hole 50 penetrating through each layer of the insulating substrate 30 needs to be formed in each layer of the insulating substrate 30 and a metal piece 60 needs to be formed in the through hole 50. The circuit structures of the qubits 40 may be arranged by forming a plurality of layers of stacked insulating substrates 30, an integration degree of the qubits 40 on the quantum chip may be greatly improved; and a same process is used in a fabrication process, facilitating production and fabrication.

Figure 7:
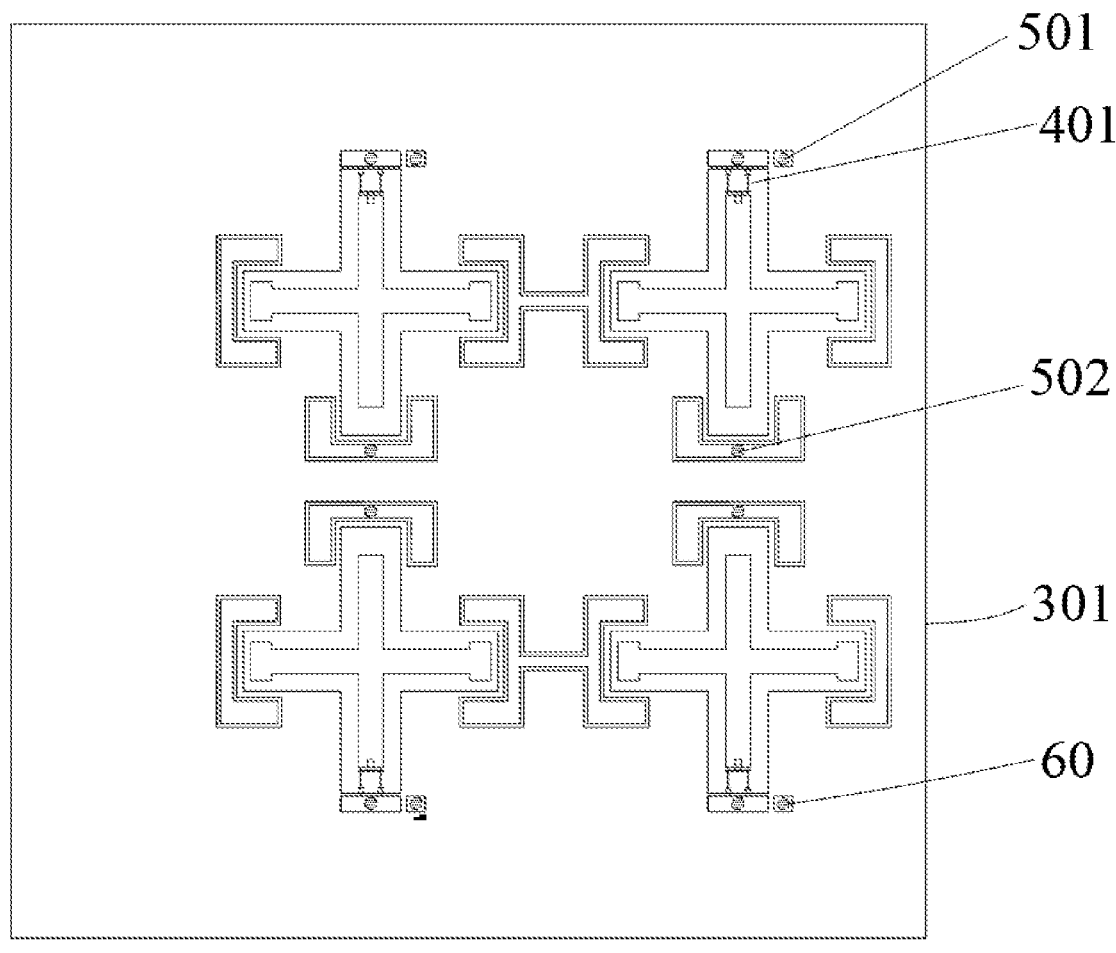
FIG. 7 is a schematic circuit diagram of a qubit on a first insulating substrate in the structure of the quantum chip in FIG. 6.
Figure 8:
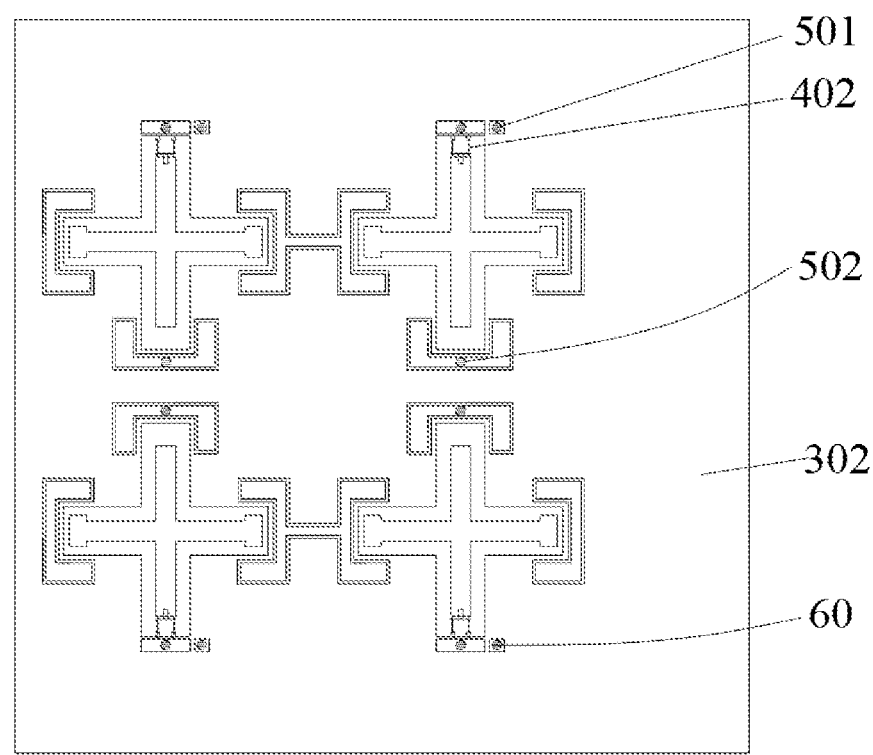
FIG. 8 is a schematic circuit diagram of a qubit on a second insulating substrate in the structure of the quantum chip in FIG. 6.

As an example, FIG. 7 is a diagram of a circuit structure of the first qubit 401 on a surface of the first insulating substrate 301, and FIG. 8 shows a diagram of a circuit structure of the second qubit 402 on a surface of the second insulating substrate 302, where a corresponding structural diagram of the base substrate 10 is shown in FIG. 3. Specifically, two through holes 50, namely, control signal line through holes 501, are formed beside the circuit structure of each of the first qubit 401 and the second qubit 402 respectively on the first insulating substrate 301 and the second insulating substrate 302. A metal piece 60 is formed in each of the through holes 50 for electrically connecting the qubit control signal line 201, and the metal piece 60 is configured to transmit signals for controlling transition frequency and transition energy of an energy level system of a qubit 40 to the qubit 40. In addition, a through hole 50, namely, a read signal line through hole 502, is formed at an end away from the structure of the qubit 40. The qubit 40 is electrically connected to a qubit microwave resonant cavity 202 located on the base substrate 10 by means of the metal piece 60 in the through hole 50, thereby transmitting information of the qubit 40 to the read signal line through hole 502.

Referring to the circuit diagram of the signal transmission lines 20 on the surface of the base substrate 10 in FIG. 3, each qubit 40 is at least paired to form at least two control signal line through holes 501 and one read signal line through hole 502, and a metal piece 60 in each of the three through holes 50 is electrically connected to a corresponding qubit 40.

For example, the metal piece 60 provided in the embodiment of the present application fully fills the through hole 50. The metal piece 60 is formed in the through hole 50 for implementing electrical connection between the base substrate 10 and a circuit structure on the insulating substrate 30. In a specific fabrication process, a metal piece 60 in a shape of a metal film may be formed on the inner surface of the through hole 50 by sputtering, or a metal piece 60 in a columnar shape may be formed inside the through hole 50. In the present application, during implementation, the metal piece 60 in a columnar shape is used, so as to avoid that the formed through hole 50 and a metal layer formed by sputtering on the surface of the through hole 50 are uneven and have a high roughness, thereby affecting transmitted control signals. The metal piece 60 in a columnar shape may be formed by fully filling the through hole 50.

Figure 9:
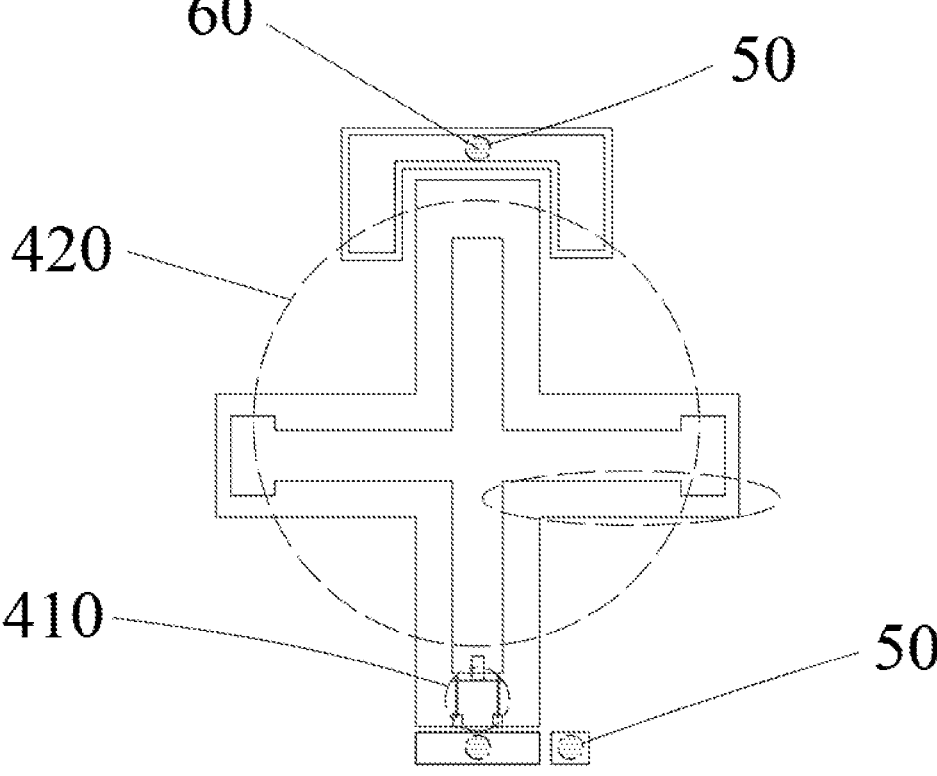
FIG. 9 is a schematic structural diagram of a circuit of a single qubit according to an embodiment of the present application.

As shown in FIG. 7, FIG. 8, and FIG. 9, for example, a capacitor 420 for connecting the qubit 40 and the metal piece 60 is formed on the insulating substrate 30 provided in the embodiment of the present application, and adjacent qubits 40 are also coupled through the capacitor 420. The qubit 40 is coupled to the qubit microwave resonant cavity 202, and the qubit microwave resonant cavity 202 is directly electrically connected to the metal piece 60, so that a capacitor 420 is provided between the qubit 40 and the metal piece 60, and a coupling effect also exists between two adjacent qubits 40, so that a capacitor 420 of a cross shape is formed. A first end of the capacitor 420 of a cross shape is directly electrically connected to the qubit 40, and a second end of the capacitor 420 is coupled to a metal piece 60 in the through hole 50 and then electrically connected to the qubit microwave resonant cavity 202. A third end and a fourth end of the capacitor 420 are respectively coupled to adjacent qubits 40, so as to realize coupling with the adjacent qubits 40.

As shown in FIG. 9, for example, when the quantum chip of the present application is a superconducting quantum chip, a qubit 40 may include a loop superconducting circuit 410 and the capacitor 420. The qubit 40 on the quantum chip is a two-level system formed by a non-linear inductor and a resonant capacitor. The non-linear inductor is a loop superconducting circuit 410 connected in parallel, and the resonant capacitor is also formed based on the capacitor 420, that is, the capacitor is formed by both cross transmission lines in the middle connected to the loop superconducting circuit 410 and surrounding ground (corresponding "ground" on the insulating substrate 30) in FIG. 9. Additionally, the metal piece 60 that is in the through hole 50 and connects the qubit 40 is connected to the loop superconducting circuit 410. A two-level resonator system equivalent to an LC resonance (classical resonant circuit) is formed by the loop superconducting circuit 410 and the resonant capacitor, and then the two-level resonant system is regulated and controlled by receiving, through the metal piece 60 connected to the loop superconducting circuit 410, a control signal transmitted on the signal transmission lines 20 located on the base substrate 10. A structure of a qubit includes, but is not limited to, the structure of the loop superconducting circuit 410 and the capacitor 420 in this embodiment.

For example, the loop superconducting circuit 410 provided in the embodiment of the present application includes at least two superconducting Josephson junctions connected in parallel. The loop superconducting circuit 410 functions as the non-linear inductor in the two-level resonant system, and the loop superconducting circuit 410 is regulated and controlled by a control signal obtained by mean of the metal piece 60 and applied to the signal transmission lines 20, specifically by applying a control signal causing a change in magnetic flux. That is, the loop superconducting circuit 410 is formed as a closed loop formed by at least two superconducting Josephson junctions connected in parallel, and the closed loop induces a change in the magnetic flux (the change in the magnetic flux is controlled and regulated by a bias voltage applied to the signal transmission lines 20), so that a parameter of the closed loop, namely, the loop superconducting circuit 410, is adjusted.

Still referring to FIG. 2 and FIG. 3, for example, a quantum chip provided in the embodiment of the present application further includes signal terminals 101, and the signal terminals 101 are formed on a side surface of the base substrate 10 and electrically connected to the signal transmission lines 20 in a one-to-one correspondence manner. The signal transmission lines 20 located on the base substrate 10 are configured to receive a regulation and control signal. The regulation and control signal is supplied from an external signal source, so that the signal terminals 101 need to be formed on the quantum chip to receive a control signal supplied from the external signal source and transmit the control signal to the qubit 40 through the signal transmission lines 20 and the metal piece 60. Since the signal transmission lines 20 on the quantum chip provided in the present application is formed on the base substrate 10, the signal terminals 101 are also formed on the base substrate 10 to facilitate direct electrical connection with the signal transmission lines 20. In addition, in order to facilitate connection with the external signal source to receive the control signal, the signal terminals 101 are formed on the side surface of the base substrate 10, and a function thereof is similar to pins of a semiconductor chip.

A fabrication method for a quantum chip is provided in some other implementations of the embodiment of the present application.

Figure 10:
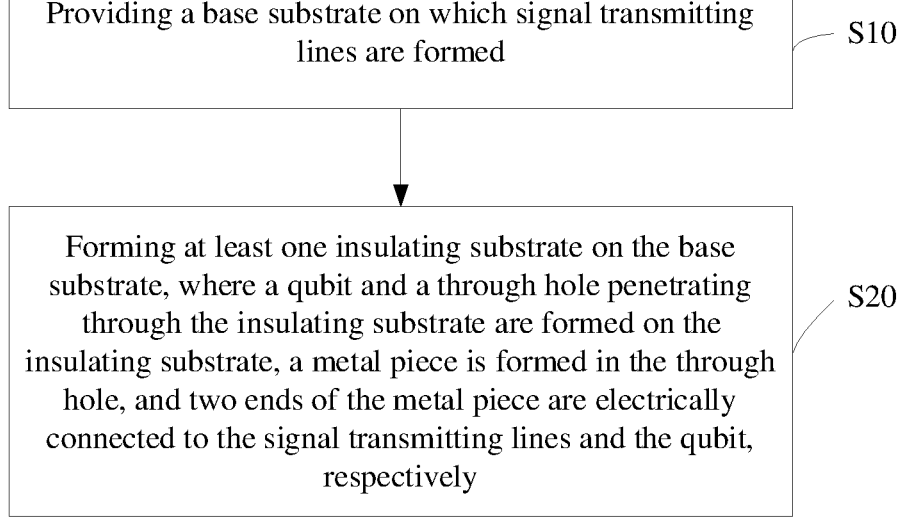
FIG. 10 shows a fabrication method for a quantum chip according to an embodiment of the present application.

FIG. 10 shows a fabrication method for a quantum chip according to an embodiment of the present application.

As shown in FIG. 10, and with reference to FIG. 2 and FIG. 4, an embodiment of the present application provides a fabrication method for a quantum chip, and the fabrication method may include the following steps.

Step S10: Providing a base substrate 10 on which signal transmission lines 20 are formed.

Specifically, a base substrate 10 is provided, and the base substrate 10 may be a sapphire substrate, a silicon substrate, or the like. First, a superconducting metal layer is formed on a surface of the base substrate 10 by using an evaporation method, atomic deposition method, and the like; and further, a metal layer is patterned, exposed, developed, and etched to form desired signal transmission lines 20.

Step S20: Forming at least one insulating substrate 30 on the base substrate 10, where a qubit 40 and a through hole 50 penetrating through the insulating substrate 30 are formed on the insulating substrate 30, a metal piece 60 is formed in the through hole 50, and two ends of the metal piece 60 are electrically connected to the signal transmission lines 20 and the qubit 40, respectively.

After the signal transmission lines 20 are formed on the base substrate 10, the insulating substrate 30 is formed on the base substrate 10 by using an atomic deposition process or a sputtering process, a through hole 50 penetrating through the insulating substrate 30 is formed on the insulating substrate 30, and a metal piece 60 is formed by filling a metal in the through hole 50, so that circuit structures on both sides of the insulating substrate 30 may be electrically connected by means of the metal piece 60.

Figure 11:
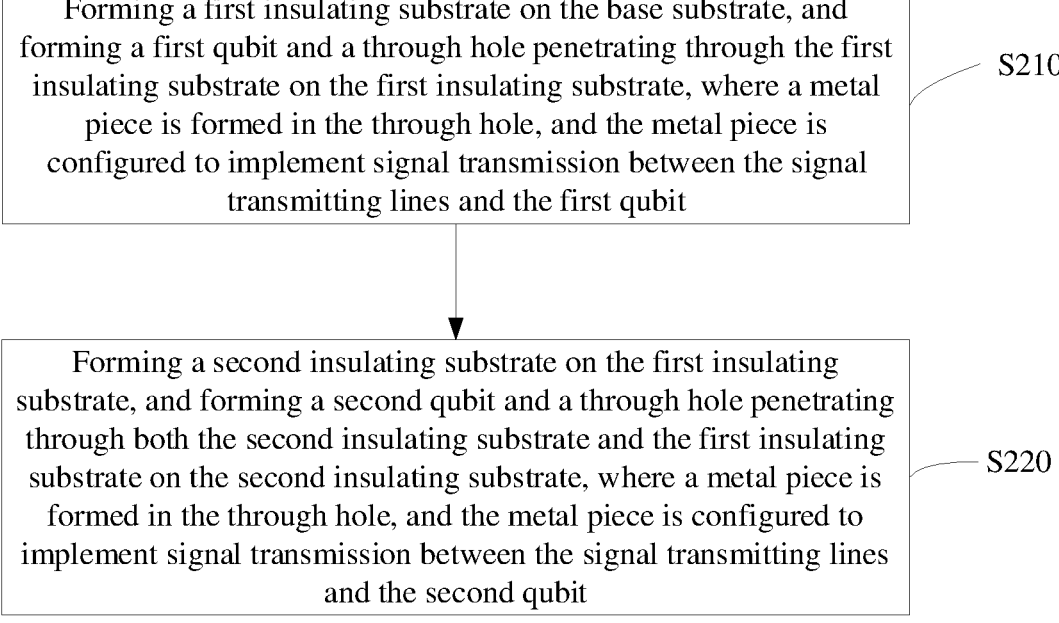
FIG. 11 shows a method for forming at least one insulating substrate according to an embodiment of the present application.

As shown in FIG. 11, and with reference to FIG. 6, for example, an embodiment of the present application provides a method for forming at least one insulating substrate 30 on the base substrate 10, and the method may include:

Step S210: forming a first insulating substrate 301 on the base substrate 10, and forming a first qubit 401 and a through hole 50 penetrating through the first insulating substrate 301 on the first insulating substrate 301, where a metal piece 60 is formed in the through hole 50, and the metal piece 60 is configured to implement signal transmission between the signal transmission lines 20 and the first qubit 401; and Step S220: forming a second insulating substrate 302 on the first insulating substrate 301, and forming, on the second insulating substrate 302, a second qubit 402 and a through hole 50 penetrating through both the second insulating substrate 302 and the first insulating substrate 301, where a metal piece 60 is formed in the through hole 50, and the metal piece 60 is configured to implement signal transmission between the signal transmission lines 20 and the second qubit 402.

The constructions, features and functions of the present application are described in detail in the embodiments with reference to the accompanying drawings. The foregoing is merely preferred embodiments of the present application, and the present application is not limited by the accompanying drawings. All equivalent embodiments that are modified or changed according to the concept of the present application and do not depart from the spirit of the description and the drawings should fall within the protection scope of the present application.

What is claimed is:

1. A quantum chip, comprising:
a base substrate on which signal transmission lines are formed; and
at least one insulating substrate, wherein the insulating substrate is located on the base substrate, a qubit and a through hole penetrating through the insulating substrate are formed on the insulating substrate, a metal piece is formed in the through hole; and two ends of the metal piece are electrically connected to the signal transmission lines and the qubit, respectively; and
an isolation layer located between the base substrate and the insulating substrate, wherein the through hole penetrates through the isolation layer, and wherein the isolation layer comprises:
an insulating isolation layer located on the base substrate, wherein the insulating isolation layer covers the signal transmission lines, and the through hole penetrates through the insulating isolation layer; and
a metal isolation layer located on the insulating isolation layer, wherein a via hole for forming a mesh is formed on the metal isolation layer, and the through hole is located in the via hole for forming a mesh.

2. The quantum chip according to claim 1, wherein the signal transmission lines comprise:
a qubit control signal line coupled to the qubit, wherein the qubit control signal line is configured to control information of the qubit;
a qubit microwave resonant cavity coupled to the qubit, wherein the qubit microwave resonant cavity is configured to read information of the qubit; and
a qubit read signal line coupled to the qubit microwave resonant cavity, wherein the qubit read signal line is configured to read information output by the qubit microwave resonant cavity.

3. The quantum chip according to claim 2, wherein the qubit microwave resonant cavity comprises a coplanar waveguide transmission line.

4. The quantum chip according to claim 1, wherein an aperture of the via hole for forming a mesh is greater than an aperture of the through hole, and the via hole for forming a mesh and the through hole are coaxially arranged.

5. The quantum chip according to claim 1, wherein the at least one insulating substrate comprises:
a first insulating substrate located on the base substrate, wherein a first qubit and a through hole penetrating through the first insulating substrate are formed on the first insulating substrate, a metal piece is formed in the through hole, and two ends of the metal piece are electrically connected to the signal transmission lines and the first qubit, respectively; and
a second insulating substrate located on the first insulating substrate, wherein a second qubit and a through hole penetrating through both the second insulating substrate and the first insulating substrate are formed on the second insulating substrate, a metal piece is formed in the through hole, and two ends of the metal piece are electrically connected to the signal transmission lines and the second qubit, respectively.

6. The quantum chip according to claim 1, wherein the metal piece fully fills the through hole and is configured to implement an electrical connection between the base substrate and a circuit structure on the insulating substrate.

7. The quantum chip according to claim 1, wherein the metal piece is a metal film formed on an inner surface of the through hole.

8. The quantum chip according to claim 1, wherein the metal piece is formed in a columnar shape inside the through hole.

9. The quantum chip according to claim 1, wherein a capacitor for connecting the qubit and the metal piece is formed on the insulating substrate.

10. The quantum chip according to claim 9, wherein adjacent qubits are coupled with each other through the capacitor.

11. The quantum chip according to claim 9, wherein when the quantum chip is a superconducting quantum chip, the qubit comprises a loop superconducting circuit and the capacitor, and the metal piece connected to the qubit and located in the through hole is connected to the loop superconducting circuit.

12. The quantum chip according to claim 11, wherein the loop superconducting circuit comprises at least two superconducting Josephson junctions connected in parallel.

13. The quantum chip according to claim 1, wherein the quantum chip further comprises signal terminals, and the signal terminals are formed on a side surface of the base substrate and electrically connected to the signal transmission lines in a one-to-one correspondence manner.

14. The quantum chip according to claim 1, wherein a material of the insulating isolation layer comprises one of silicon dioxide, amorphous silicon and Teflon.

15. The quantum chip according to claim 1, wherein the qubit is at least paired to form at least two control signal line through holes and one read signal line through hole.

16. A fabrication method for a quantum chip, comprising:
providing a base substrate on which signal transmission lines are formed;
forming at least one insulating substrate on the base substrate, wherein a qubit and a through hole penetrating through the insulating substrate are formed on the insulating substrate, a metal piece is formed in the through hole, and two ends of the metal piece are electrically connected to the signal transmission lines and the qubit, respectively; and forming an isolation layer between the base substrate and the insulating substrate, wherein the through hole penetrates through the isolation layer, and wherein the isolation layer comprises:

an insulating isolation layer located on the base substrate, wherein the insulating isolation layer covers the signal transmission lines, and the through hole penetrates through the insulating isolation layer; and a metal isolation layer located on the insulating isolation layer, wherein a via hole for forming a mesh is formed on the metal isolation layer, and the through hole is located in the via hole for forming a mesh.

17. The fabrication method according to claim 16, wherein the step of forming at least one insulating substrate on the base substrate, wherein a qubit and a through hole penetrating through the insulating substrate are formed on the insulating substrate, a metal piece is formed in the through hole, and two ends of the metal piece are electrically connected to the signal transmission lines and the qubit, respectively comprises:

forming a first insulating substrate on the base substrate, and forming a first qubit and a through hole penetrating through the first insulating substrate on the first insulating substrate, wherein a metal piece is formed in the through hole, and two ends of the metal piece are electrically connected to the signal transmission lines and the first qubit, respectively; and forming a second insulating substrate on the first insulating substrate, and forming a second qubit and a through hole penetrating through both the second insulating substrate and the first insulating substrate on the second insulating substrate, wherein a metal piece is formed in the through hole, and two ends of the metal piece are electrically connected to the signal transmission lines and the second qubit, respectively.

* * * * *